United States Patent
Chainer et al.

(10) Patent No.: US 9,750,165 B2
(45) Date of Patent: Aug. 29, 2017

(54) COOLANT AND AMBIENT TEMPERATURE CONTROL FOR CHILLERLESS LIQUID COOLED DATA CENTERS

(71) Applicant: INTERNATIONAL BUSINESS MACHINES CORPORATION, Armonk, NY (US)

(72) Inventors: Timothy J. Chainer, Putnam Valley, NY (US); Milnes P. David, Fishkill, NY (US); Madhusudan K. Iyengar, Woodstock, NY (US); Pritish R. Parida, Fishkill, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 190 days.

(21) Appl. No.: 14/792,196

(22) Filed: Jul. 6, 2015

(65) Prior Publication Data
US 2015/0316334 A1 Nov. 5, 2015

Related U.S. Application Data

(62) Division of application No. 13/439,471, filed on Apr. 4, 2012, now Pat. No. 9,250,636.

(51) Int. Cl.
*G05D 23/00* (2006.01)
*H05K 7/20* (2006.01)
(Continued)

(52) U.S. Cl.
CPC ......... *H05K 7/20836* (2013.01); *F28F 27/02* (2013.01); *G05D 23/1932* (2013.01);
(Continued)

(58) Field of Classification Search
CPC ............ H05K 7/20836; G05D 23/1932; G06F 1/2016; G06F 2200/201; F28F 27/02; Y02B 60/1275
(Continued)

(56) References Cited

U.S. PATENT DOCUMENTS

| | | | | |
|---|---|---|---|---|
| 5,301,743 A | * | 4/1994 | Mizuno | ................... G05D 23/24 165/104.33 |
| 6,450,254 B1 | * | 9/2002 | Hoyle | ..................... G01M 3/26 165/101 |

(Continued)

FOREIGN PATENT DOCUMENTS

WO 2010002388 1/2010

OTHER PUBLICATIONS

U.S. Office Action mailed Mar. 25, 2015 in U.S. Appl. No. 13/439,433.
(Continued)

*Primary Examiner* — Ljiljana Ciric
(74) *Attorney, Agent, or Firm* — Tutunjian & Bitetto, P.C.; Daniel P. Morris (57) ABSTRACT

Cooling control methods and systems include measuring a temperature of air provided to one or more nodes by an air-to-liquid heat exchanger; measuring a temperature of at least one component of the one or more nodes and finding a maximum component temperature across all such nodes; comparing the maximum component temperature to a first and second component threshold and comparing the air temperature to a first and second air threshold; and controlling a proportion of coolant flow and a coolant flow rate to the air-to-liquid heat exchanger and the one or more nodes based on the comparisons.

8 Claims, 7 Drawing Sheets

(51) Int. Cl.
  *F28F 27/02* (2006.01)
  *G06F 1/20* (2006.01)
  *G05D 23/19* (2006.01)
(52) U.S. Cl.
  CPC ........ *G06F 1/206* (2013.01); *G06F 2200/201* (2013.01); *Y02B 60/1275* (2013.01)
(58) Field of Classification Search
  USPC ...................................................... 165/289
  See application file for complete search history.

(56) References Cited

U.S. PATENT DOCUMENTS

| | | | | |
|---|---|---|---|---|
| 6,574,104 B2* | 6/2003 | Patel | ................. | H05K 7/20745 |
| | | | | 165/104.33 |
| 7,013,968 B2* | 3/2006 | Beitelmal | ............... | G06F 1/206 |
| | | | | 165/244 |
| 7,117,129 B1* | 10/2006 | Bash | ..................... | G05B 13/027 |
| | | | | 700/276 |
| 7,373,268 B1* | 5/2008 | Viredaz | ..................... | G06F 1/20 |
| | | | | 702/130 |
| 7,630,795 B2* | 12/2009 | Campbell | ............... | F28D 15/00 |
| | | | | 361/701 |
| 7,657,347 B2* | 2/2010 | Campbell | ............ | G01F 1/6965 |
| | | | | 137/340 |
| 7,757,506 B2 | 7/2010 | Ellsworth et al. | | |
| 7,979,250 B2* | 7/2011 | Archibald | ........... | G06F 17/5004 |
| | | | | 361/600 |
| 8,560,132 B2* | 10/2013 | Matteson | ........... | H05K 7/20836 |
| | | | | 165/287 |
| 8,794,017 B2 | 8/2014 | Bash et al. | | |
| 2003/0193777 A1* | 10/2003 | Friedrich | ................ | G06F 1/206 |
| | | | | 361/679.53 |
| 2003/0221821 A1* | 12/2003 | Patel | ..................... | F24F 11/001 |
| | | | | 165/247 |
| 2004/0162697 A1* | 8/2004 | Smith | ..................... | G06F 1/206 |
| | | | | 702/132 |
| 2007/0213881 A1* | 9/2007 | Belady | ................... | G05D 23/19 |
| | | | | 700/300 |
| 2008/0204999 A1* | 8/2008 | Clidaras | ............. | H05K 7/20745 |
| | | | | 361/696 |
| 2009/0219681 A1* | 9/2009 | Goth | ..................... | F25B 49/02 |
| | | | | 361/679.53 |
| 2009/0259343 A1* | 10/2009 | Rasmussen | .......... | H05K 7/2079 |
| | | | | 700/282 |
| 2010/0032142 A1* | 2/2010 | Copeland | ........... | G05D 23/1925 |
| | | | | 165/104.33 |
| 2010/0057259 A1* | 3/2010 | Dawson | ................ | G05B 15/02 |
| | | | | 700/278 |
| 2010/0076607 A1* | 3/2010 | Ahmed | ................... | G06F 1/206 |
| | | | | 700/276 |
| 2010/0078160 A1* | 4/2010 | Novotny | .................... | F24F 3/06 |
| | | | | 165/247 |
| 2010/0263855 A1* | 10/2010 | Arimilli | ............. | G05D 23/1931 |
| | | | | 165/288 |
| 2011/0056675 A1* | 3/2011 | Barringer | ........... | H05K 7/20736 |
| | | | | 165/299 |
| 2011/0060470 A1* | 3/2011 | Campbell | .......... | G05D 23/1934 |
| | | | | 700/282 |
| 2011/0100045 A1* | 5/2011 | Carlson | .............. | H05K 7/20836 |
| | | | | 62/259.2 |
| 2011/0112694 A1 | 5/2011 | Bash et al. | | |
| 2011/0151765 A1 | 6/2011 | Chen et al. | | |
| 2011/0256822 A1* | 10/2011 | Carlson | .............. | H05K 7/20827 |
| | | | | 454/184 |
| 2012/0024501 A1* | 2/2012 | Campbell | ............ | H05K 7/2079 |
| | | | | 165/104.33 |
| 2012/0318492 A1* | 12/2012 | Keisling | ............ | H05K 7/20827 |
| | | | | 165/287 |
| 2013/0048266 A1* | 2/2013 | Bauchot | ............. | H05K 7/20836 |
| | | | | 165/299 |
| 2013/0098085 A1* | 4/2013 | Judge | .................. | H05K 7/20827 |
| | | | | 62/180 |
| 2013/0098599 A1* | 4/2013 | Busch | ................ | H05K 7/20209 |
| | | | | 165/294 |
| 2013/0242504 A1* | 9/2013 | Cartes | ................ | G05D 23/1931 |
| | | | | 361/679.49 |
| 2013/0264044 A1* | 10/2013 | Kearney | .................. | F28F 27/00 |
| | | | | 165/200 |
| 2014/0069626 A1* | 3/2014 | Lin | ............................ | G06F 1/20 |
| | | | | 165/287 |
| 2014/0218858 A1* | 8/2014 | Shelnutt | .................. | G06F 1/206 |
| | | | | 361/679.31 |
| 2014/0218859 A1* | 8/2014 | Shelnutt | .................. | G06F 1/206 |
| | | | | 361/679.46 |
| 2014/0218861 A1* | 8/2014 | Shelnutt | .................... | G06F 1/20 |
| | | | | 361/679.53 |
| 2014/0298839 A1* | 10/2014 | Nagamatsu | ........ | H05K 7/20745 |
| | | | | 62/186 |
| 2014/0362526 A1* | 12/2014 | Wang | ................. | H05K 7/20836 |
| | | | | 361/679.48 |
| 2015/0019711 A1* | 1/2015 | Zhang | ................. | H04L 43/0817 |
| | | | | 709/224 |
| 2015/0105932 A1* | 4/2015 | Hunt | ....................... | H04L 47/25 |
| | | | | 700/300 |
| 2016/0062373 A1* | 3/2016 | King | ..................... | G05B 15/02 |
| | | | | 700/300 |

OTHER PUBLICATIONS

Chen, Y., et al. "Managing Server Energy and Operational Costs in Hosting Centers" Proceedings of the 2005 ACM Sigmetrics International Conference on Measurement and Modeling of Computer Systems. Jun. 2005. pp. 303-314.

Harrington, S., "Optimal Heat Transfer for Liquid Cooling With Minimal Coolant Volume" 27th Annual IEEE Semiconductor Thermal Measurement and Management Symposium, Mar. 2011. (5 Pages).

Huang, W., et al. "TAPO: Thermal-Aware Power Optimization Techniques for Servers and Data Centers" Green Computing Conference and Workshops (IGCC), Jul. 2011. (8 Pages).

Pakbaznia, E., et al. "Temperature-Aware Dynamic Resources Provisioning in a Power-Optimized Datacenter" Design, Automation and Test in Europe Conference and Exhibition, Mar. 2010. (6 Pages).

\* cited by examiner

COOLANT AND AMBIENT TEMPERATURE CONTROL FOR CHILLERLESS LIQUID COOLED DATA CENTERS

RELATED APPLICATION INFORMATION

This application is a Divisional of application Ser. No. 13/439,471, filed on Apr. 4, 2012, incorporated herein by reference. This application is related to application Ser. No. 13/439,433, filed Apr. 4, 2012, incorporated herein by reference.

GOVERNMENT RIGHTS

This invention was made with Government support under Contract No.: DE-EE0002894 (Department of Energy). The government has certain rights in this invention.

BACKGROUND

Technical Field

The present invention relates to data center design and, more particularly to energy-efficient cooling systems in large data centers.

Description of the Related Art

Data centers are facilities that house numerous computer systems arranged in the form of electronics racks. Typically, a data center houses on the order thousands of electronic racks. Each computer system in a rack may include one or more processors, memory devices, controllers, power converters and manipulators, and other such electronic components. Depending upon the state of operation, a computer system may dissipate on the order of hundreds of Watts to thousands of Watts. Therefore, a significant amount of cooling is used to keep the electronic components within an optimum operating temperature range. Server driven power usage amounts to a significant portion of total US energy consumption. Liquid cooling solutions, which may include transferring 100% of the heat dissipated by the rack(s) to water, eliminating the facility air conditioning units, use of building chilled water to cool the racks, use of energy efficient chillers to provide relatively lower temperature coolants to the rack(s), and many other liquid cooling solutions, have been proposed as a means to reduce data center cooling/total power consumption. However, such solutions are far from optimal in their cooling energy efficiency.

Furthermore, many cooling systems are at least partially based on air cooling. Cool air is pumped into servers, cools auxiliary components, and exists as warmer air. A heat exchanger cools the air, which re-enters the server as cool air. Although liquid-cooled components can be overcooled, the temperature difference between coolant temperature entering the air heat exchanger and the air temperature leaving the air heat exchanger can become a limiting factor.

SUMMARY

A cooling control method includes measuring a temperature of air provided to one or more nodes by an air-to-liquid heat exchanger; measuring a temperature of at least one component of the one or more nodes and finding a maximum component temperature across all such nodes; comparing the maximum component temperature to a first and second component threshold and comparing the air temperature to a first and second air threshold; and controlling a proportion of coolant flow and a coolant flow rate to the air-to-liquid heat exchanger and the one or more nodes based on said comparisons.

A further cooling control method includes measuring a temperature of air provided to one or more nodes by an air-to-liquid heat exchanger; measuring a temperature of at least one component of the one or more nodes and finding a maximum component temperature across all such nodes; comparing the maximum component temperature to a first and second component threshold and comparing the air temperature to a first and second air threshold; and controlling a proportion of coolant flow and a coolant flow rate to the air-to-liquid heat exchanger and the one or more nodes based on said comparisons by adjusting one or more valves that control relative flow rate between the air-to-liquid heat exchanger and the one or more nodes.

A cooling system includes one or more nodes, each node having at least one temperature sensor to monitor a temperature of internal node components; an air-to-liquid heat exchanger configured to accept a liquid coolant input and to provide cooled air to the one or more nodes; a temperature sensor to monitor a temperature of the air provided by the air-to-liquid heat exchanger; a liquid cooling system configured to provide liquid coolant to components of the one or more nodes; a valve configured to control coolant flow to the air-to-liquid heat exchanger and the liquid cooling system based on the temperature of internal node components and the temperature of the air provided by the air-to-liquid heat exchanger; and a pump configured to provide liquid coolant to the liquid cooling system and the air-to-liquid heat exchanger, having a pump strength that is based on the temperature of internal node components and the temperature of the air provided by the air-to-liquid heat exchanger.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide for temperature measurements at various points within a cooling system that combines liquid- and air-based cooling. This temperature information is used to control coolant flow through a rack and through individual servers. By tuning the temperature difference between liquid coolant and air flowing through the servers, cooling efficiency can be maximized.

Figure 1:
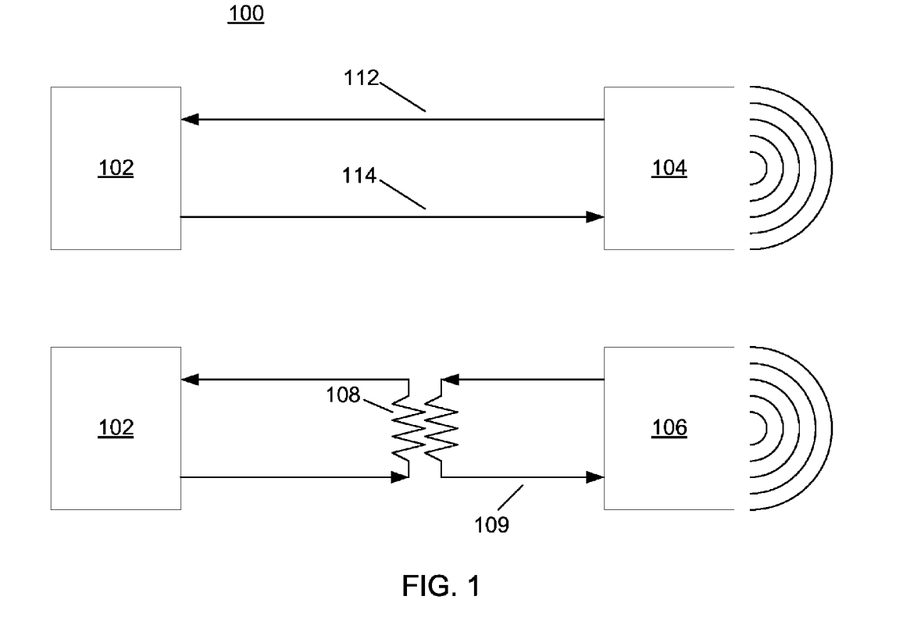
FIG. 1 is a diagram of single-loop and double-loop cooling systems.

Referring now to the drawings in which like numerals represent the same or similar elements and initially to FIG. 1, an exemplary data center cooling system 100 is shown. The data center includes a number of racks 102, which circulate coolant. Low-temperature coolant 112 enters the racks 102, picks up heat, and leaves the racks 102 as high-temperature coolant 114. Although the present invention is described herein with respect to racks of servers, it is contemplated that any appropriate structure could be employed. In particular, any clustering, grouping, or other organization of computing devices or structures could be cooled using the present principles.

FIG. 1 shows a system that has both liquid-to-air heat exchangers 104 and liquid-to-liquid heat exchangers (LLHx) 108 In a liquid-to-air cooling arrangement, high-temperature coolant 114 passes directly to an air-side outdoor exchanger 104, for example a set of cooling fins. Any appropriate type of heat exchange may be used in place of the liquid-to-air exchanger 104, including dry coolers, a building's chilled water supply, a cooling tower, a wet cooler, a building's heating or heat recovery systems, a geothermal loop, or a combination of multiple kinds. In a liquid-to-liquid cooling arrangement, high-temperature coolant 114 passes through a paired cooling coil. A heat exchanger 106 has a separate coolant circulation system that also feeds into the paired cooling coil of LLHx 108. The coolant from the heat exchanger 106 reduces the temperature of the high-temperature coolant 114 without mixing, before dissipating its heat at heat exchanger 106. The LLHxes 108 may be optionally turned off by shutting off the flow of coolant through the paired cooling coil. Additionally, multiple LLHxes 108 may be arranged along a single double-loop line, such that external heat dissipation may be controlled by enabling an appropriate number of heat exchangers 108.

The rate of heat transfer at the rack(s) 102 is predominantly governed by the liquid coolant flow rate through them. At the outdoor heat exchangers 104 and 106, the heat transfer rate is governed by the outdoor heat exchanger's air-side flow rate and the liquid coolant flow rate through the outdoor heat exchanger 104. The heat transfer rate is a non-linear monotonically increasing function of air-side flow rate and liquid coolant flow rate. For any given heat exchanger design, there is a limit to the air-side flow rate and liquid flow rate. These limits are used to guide the heat exchanger selection so as to meet the maximum cooling requirements (the worst case scenario) by a safe margin. "Worst case scenario" here refers to the highest ambient air temperature and highest heat dissipation expected at the rack(s), and in a more general sense, highest heat dissipation at the data center, occurring simultaneously. The "worst case scenario" should be rare and might not even occur over the entire life cycle of the data center.

In some more common situations, an electronic rack 102 might be partially filled. Moreover, with data center provisioning (for example, powering off servers whose resources are not being used, etc.) being widely used to reduce the IT power usage, powered-off servers within a rack 102 might also be cooled, even those servers which would not generate heat. These situations may result in more cooling power consumption than is needed for almost the entire life cycle of data center. Hence, liquid cooling distribution hardware and controls based on physical infrastructure and environmental conditions both inside and outside the data center, may be used to properly optimize the cooling power consumption and further reduce the data center energy usage.

Figure 2:
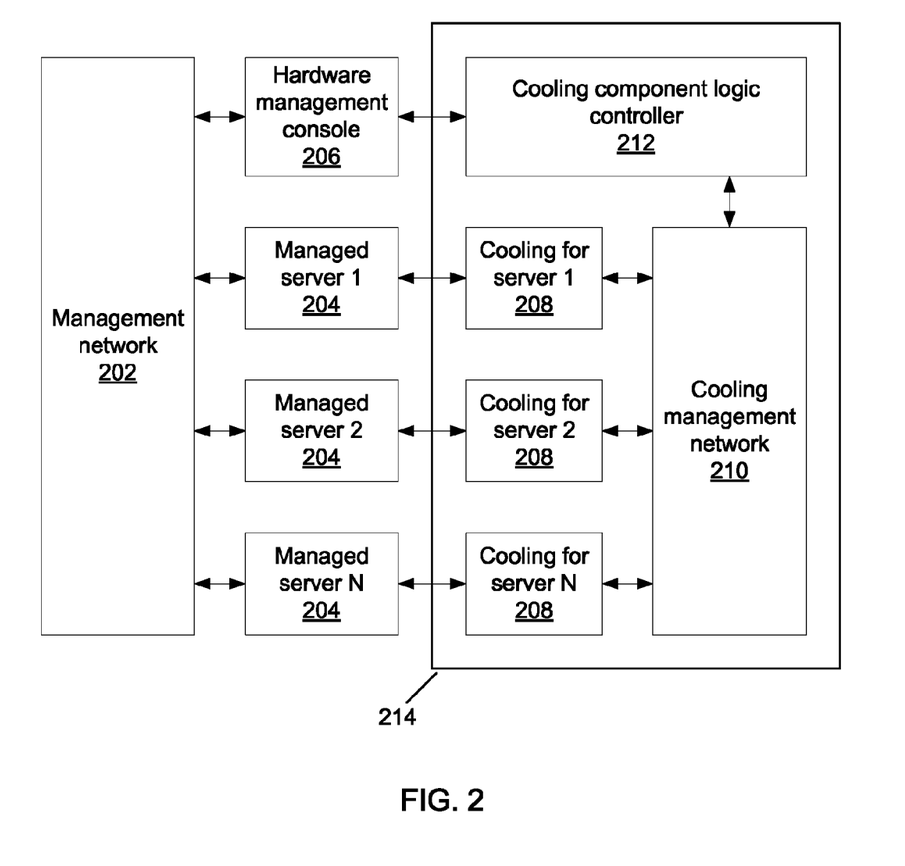
FIG. 2 is a diagram of an exemplary intra-rack cooling system according to the present principles.

Referring now to FIG. 2, a system for managed cooling of servers at an intra-rack level is shown. A plurality of managed servers 204 are shown, each connected to a hardware management console (HMC) 206 by a management network 202. The HMC 206 controls workload implementation in the servers 204 and may include, e.g., one or more hypervisor nodes. Each managed server 204 has a corresponding cooling unit 208, and the cooling units 208 are controlled by a cooling component logic controller 212 through a cooling management network 210. Together, the cooling components and controls form cooling system 214. The logic controller 212 receives information about outdoor ambient conditions, such as temperature information. Because outdoor temperature is related to cooling efficiency, the logic controller 212 can use that information to control factors such as coolant flow rate.

The present principles reduce cooling power consumption by providing liquid cooling only to the components that require cooling. For example, if a managed server 204 is in off-state, then this status information can be fed to the cooling logic controller 212, which would then take steps to close the coolant flow to that server 204 without affecting the coolant flow to any other server. To take another example, if the managed server 204 needs to be powered ON, then this information can also be fed to the cooling logic controller 212 so that cooling to the server 204 can be activated. Cooling can furthermore be tuned to particular levels corresponding to the workload at a server 204, with higher workloads allocating more cooling. This system applies to the inter-rack level as naturally as to the intra-rack level.

Figure 3:
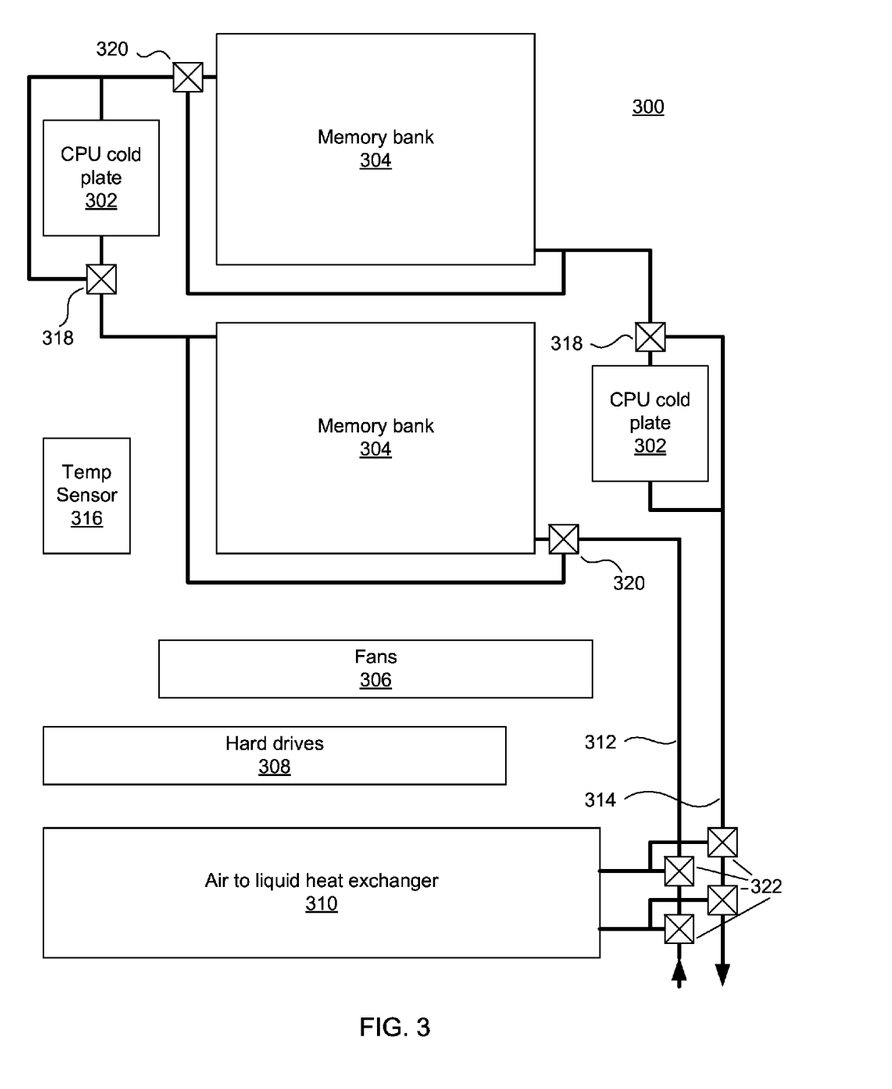
FIG. 3 is a diagram of an intra-server cooling system according to the present principles.

Referring now to FIG. 3, a schematic of an air- and liquid-cooled server 300 is shown. In addition to liquid-cooled components, such as CPU cold plates 302 and memory banks 304, many components in a server 300 may be air-cooled. For example, hard drives 308 are frequently air-cooled. Additionally, memory banks 304 may be cooled by a combination of liquid- and air-cooling. Cool coolant liquid 312 enters the server 300 from an external cooling system. The coolant 312 enters memory banks 304 and CPU cold plates 302, being warmed in the process and becoming warm coolant liquid 314 to exit the server 300.

An air-to-liquid heat exchanger (ALHx) 310 may be mounted on server 300 or on the side of a rack 102 as a sidecar unit and is attached to the coolant lines 312 and 314. The ALHx may be connected to the coolant lines in either order, taking either warm coolant 314 or cool coolant 314 as its input, depending on desired air temperature. Air circulates within the server 300 by the fans 306 and is warmed by, e.g., hard drives 308 and memory banks 304. The air exits the server as warm air and is then passed through the ALHx 310, which cools the air before recirculating it into server 300. There may be substantial air temperatures within the server 300, and so multiple ALHxes 310 may be employed to provide uniform conditions.

As noted above, the ALHx 310 may be connected to coolant lines 312 and 314 in either order, taking either cool coolant or warm coolant as input. In some situations, memory banks 304 may be liquid cooled as well as air cooled. In this case, part of the heat dissipated by the memory banks 304 goes into the air, while part of the heat goes into the liquid coolant. This fraction of heat is dependent on the air and liquid temperature that the memory banks 304 are exposed to. As such, by having warmer air enter the server 300, heat going in to the air from the memory banks 304 may be minimized. This increases the efficiency of cooling at the rack level. The ALHx 310 may also be connected to the coolant lines 312 and 314 using valves that allow the coolant flow to be reversed through ALHx 310, taking warm coolant, cool coolant, or a combination of the two, as input as circumstances demand. The cooling input to the ALHx 310 may be controlled using valves 322.

Liquid cooling at the server level may also be tuned. For example, memory banks 304 may be partially populated and individual CPUs 302 may have varying workloads or be shut off entirely. Individual memory slots within banks 304 may be selectively cooled according to whether those slots are in use, and CPU cold plates 302 may be adjusted or shut off using valves 318 according to CPU usage. Cooling for entire memory banks 304 may be shut off using valves 320. Cooling within the server 300 may further be controlled based on direct measurements of ambient temperature using, e.g., temperature sensor 316. Temperature sensor may be used to provide direct feedback to, e.g., ALHx 310 as well as to external cooling logic 212, which may in turn tune cooling settings according to desired conditions.

Figure 4:
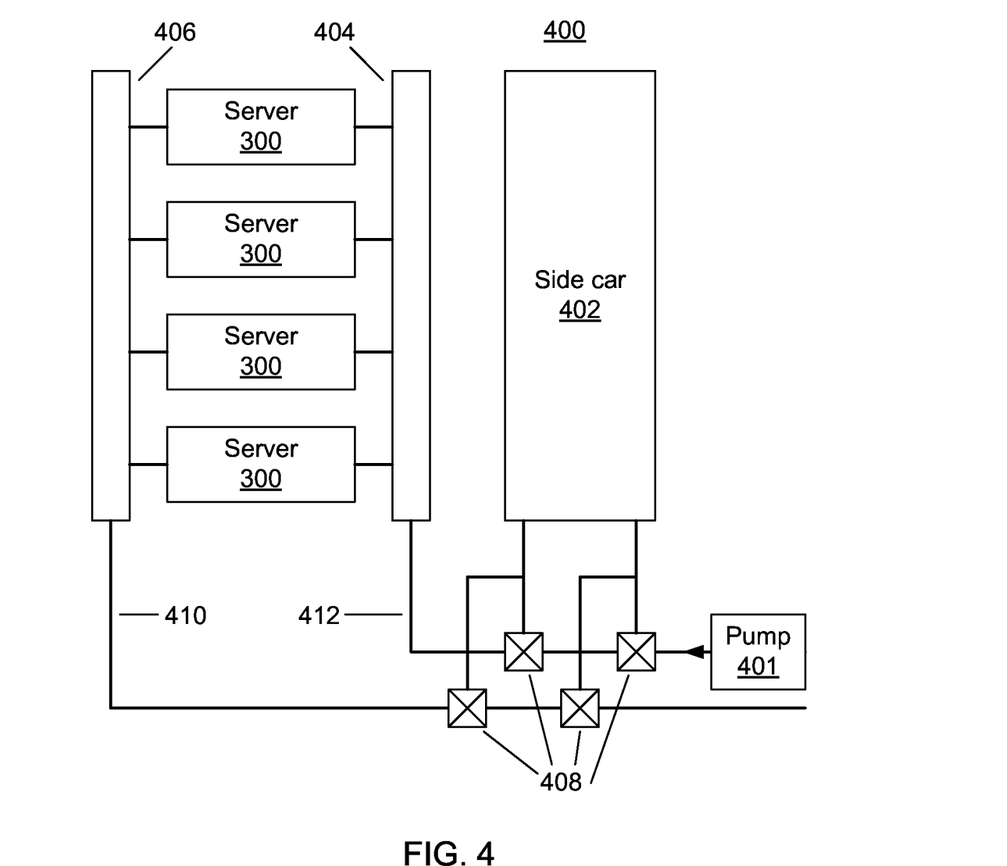
FIG. 4 is a diagram of an exemplary intra-rack cooling system according to the present principles.

Referring now to FIG. 4, an embodiment of an intra-rack cooling system is shown. A set of servers 300 are connected in parallel to a coolant inlet plenum 404 and a coolant outlet plenum 406. Inlet plenum 404 receives cold input coolant 412 from a pump 401 that draws from outside the rack 400. Outlet plenum 406 collects warm coolant 410 from the servers 300, which leaves the rack 400 to be cooled as shown above in, e.g., FIG. 1.

An ALHx side car 402 is connected to the input coolant line 412 and the output coolant line 410 by actively controlled three-way valves 408. Valves 408 are used to regulate the flow to the inlet plenum 404 and to side car 402. Because the side car 402 is inside the rack 400, by regulating the flow of coolant to the side car 402, the rack ambient air temperature leaving the side car 402 and entering servers 300 can be controlled. This side car 402 could be connected either to the cold coolant line 412, where coolant would flow through the sidecar 402 before entering the inlet plenum 404, or to the warm coolant line 410, where coolant would flow through the sidecar 402 after leaving the outlet plenum 406. In an alternative embodiment, coolant could be drawn from both coolant lines 410 and 412. Connecting the side car 402 to the cold coolant line 412 results in cooler air going through the servers 300 and may be useful in situations where air-cooled components, such as hard drives 308, require additional cooling. Connecting the side car 402 to the warm coolant line 410 results in warmer air going through servers 300, which may be useful in situations where heat going into the air at the server level should be minimized and heat going into the liquid at the server level should be maximized.

Figure 5:
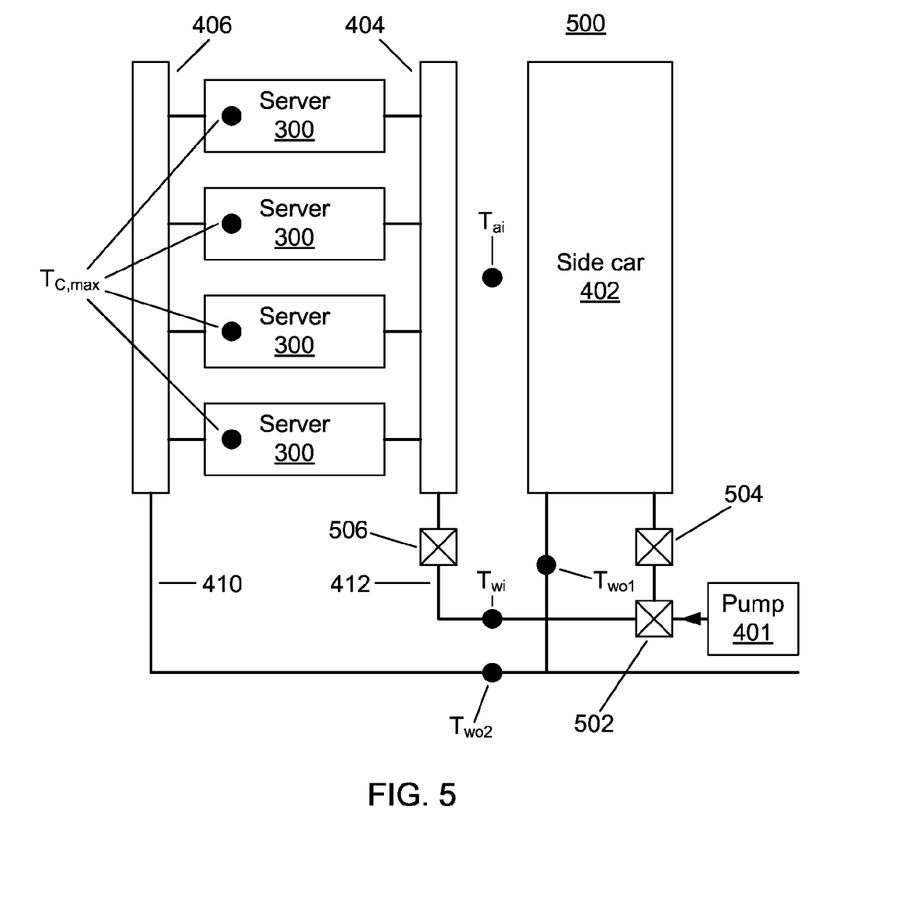
FIG. 5 is a diagram of an exemplary intra-rack cooling system according to the present principles.

Referring now to FIG. 5, an alternative embodiment of an intra-rack cooling system 500 is shown. A three-way, flow-directing valve 502 is disposed between side car 402 and the inlet plenum 404, so that liquid can be directed to one or the other and a relative flow rate can be controlled. FIG. 5 also shows a set of temperature measurements that may be used to monitor and control cooling efficiency. In particular, the temperature of input coolant 412 is measured as $T_{wi}$, the temperature of the air output by side car 402 is measured as $T_{ai}$, the temperatures of important components within servers 300 is measured, and the maximum of those temperatures is measured as $T_{C,max}$, the temperature of the coolant output 410 by outlet plenum 406 is measured as $T_{wo2}$, and the coolant output by the sidecar 402 is measured as $T_{wo1}$.

The cooling system 500 may optionally include two two-way valves 504 and 506. These valves offer more precise control of coolant flow to the inlet plenum 404 and the side car 402. Although adjustments to the three-way valve 502 and the pump 401 can accommodate any balance of coolant flow, doing so may be accomplished with fewer steps simply by adjusting one of the two-way valves 504 and 506.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 6:
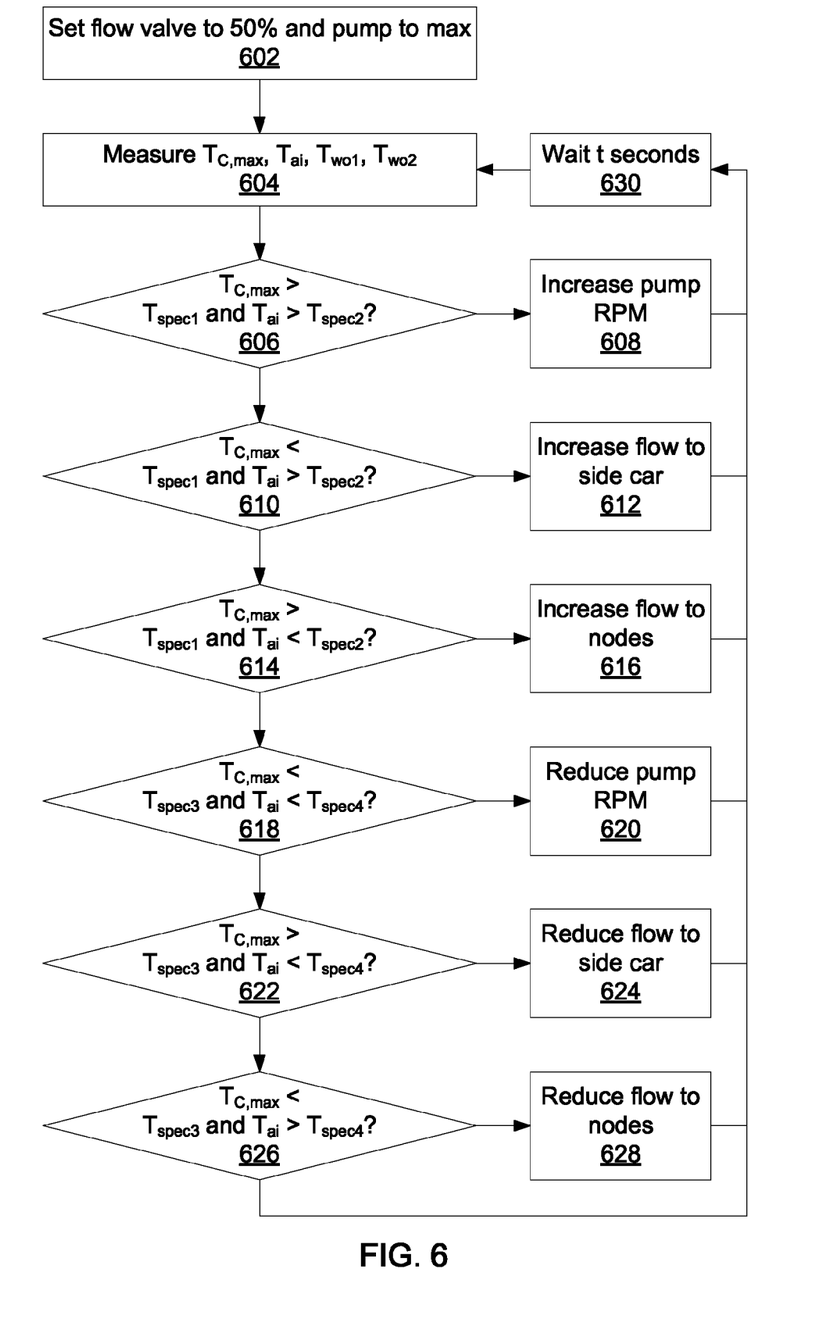
FIG. 6 is a block/flow diagram of an exemplary method for cooling control according to the present principles.

Referring now to FIG. 6, a block/flow diagram of a method for controlling coolant and air temperature is shown. This can be accomplished by adjusting the position of valve 502, thereby changing the proportion of coolant flowing through the side car 402 and servers 300. Block 602 begins by setting the pump to maximum RPM and opening the valve to 50%, thereby sending equal coolant to the side car 402 and inlet plenum 404. Next, block 604 checks the monitored temperatures, in particular obtaining measurements for $T_{ai}$, $T_{wo1}$, $T_{wo2}$, and taking the maximum component temperature $T_{C,max}$.

Four set temperatures, $T_{spec1}$, $T_{spec2}$, $T_{spec3}$, and $T_{spec4}$, are used for comparison. These values represent, respectively, a high temperature threshold for server components, a high temperature threshold for the temperature of air leaving the side car 402, a low temperature threshold for server components, and a low temperature threshold for the temperature of air leaving the side car 402. Block 606 determines whether the maximum component temperature, $T_{C,max}$, exceeds the high temperature threshold for components and whether the measured air temperature, $T_{ai}$, exceeds the high temperature threshold for air. If so, it is determined that there is not enough coolant flow to the rack 500. Block 608 increases the RPM of a pump 401, thereby increasing the flow to the rack 500, proportionally increasing flow to the inlet plenum 404 and the side car 402. Block 608 may also trigger a notification regarding the status of the determined cooling system. This may, for example, include a visual message such an error display on a screen or an indicator light, or an audio message such as a verbal notification or a beep code. After the pump RPM is increased at block 608, block 630 waits t seconds before returning to block 604. The amount of time waited can be any appropriate amount of time, and may be made to depend on the variability of cooling needs. For example, if the servers operate under a constant workload, then the wait time may be long. In data centers where workloads vary over time, the wait time may be made shorter, to allow for rapid adjustments to cooling parameters.

Block 610 checks whether $T_{C,max}$ falls below the high temperature threshold for components and whether the measured air temperature, $T_{ai}$, exceeds the high temperature threshold for air. If so, block 612 adjusts valve 502 to increase flow to side car 402. Alternatively, two-way valve 504 may be opened, allowing additional coolant flow to the side car 402. The amount of change may be based on the amount of excess in $T_{ai}$ or may be a fixed percentage. Block 612 may also trigger a notification regarding the status of the determined cooling system, in particular notifying an administrator that there is too little coolant flow to the side car 402.

Block 614 checks whether $T_{C,max}$ exceeds the high temperature threshold for components and whether the measured air temperature, $T_{ai}$, falls below the high temperature threshold for air. In this case, block 616 may notify a system administrator that there is too little coolant flow to the servers 300. Block 616 also increases flow to the servers 300 by adjusting valve 502. Alternatively, two-way valve 506 may be opened, allowing additional coolant flow to the servers 300. The amount of change may be based on the amount of excess in $T_{C,max}$ or may be a fixed percentage.

Block 618 determines whether $T_{C,max}$ falls below the low temperature threshold for components and whether the measured air temperature, $T_{ai}$, falls below the low temperature threshold for air. In this case, block 620 may notify a system administrator that there is too much coolant flow to the servers 300. Block 620 also decreases the RPM of pump 401, thereby increasing the flow to the rack 500, proportionally increasing flow to the inlet plenum 404 and the side car 402.

Block 622 determines whether $T_{C,max}$ exceeds the low temperature threshold for components and whether the measured air temperature, $T_{ai}$, falls below the low temperature threshold for air. In this case, block 624 may notify a system administrator that there is too much coolant flow to the sidecar 402. Block 624 also adjusts valve 502 to decrease flow to side car 402. Alternatively, two-way valve 504 may be opened, allowing additional coolant flow to the side car 402. The amount of change may be based on the amount of shortfall in $T_{ai}$ or may be a fixed percentage.

Block 626 determines whether $T_{C,max}$, falls below the low temperature threshold for components and whether the measured air temperature, $T_{ai}$, exceeds the low temperature threshold for air. In this case, block 628 may notify a system administrator that there is too much coolant flow to the servers 300. Block 628 also adjusts valve 502 to decrease flow to servers 300. Alternatively, two-way valve 506 may be opened, allowing additional coolant flow to the servers 300. The amount of change may be based on the amount of shortfall in $T_{C,max}$ or may be a fixed percentage.

After each adjustment, processing goes to block 630, waits for t seconds as described above, and returns processing to block 604 to repeat. In this manner, the cooling parameters may be continually adjusted, including the RPM of pump 402 and the state of the three-way valve 502 and two-way valves 504 and 506.

In an alternative embodiment, $T_{wi}$, $T_{wo1}$, or $T_{wo2}$ may be used instead of $T_{C,max}$. Additionally, $T_{wi}$ and $T_{wo2}$, along with the liquid coolant flow rate through the servers/nodes, can be used to measure the heat load going into the liquid coolant at the server/rack level. Similarly, $T_{wi}$ and $T_{wo1}$, along with the liquid coolant flow rate through the side car air-to-liquid heat exchanger 402 can be used to measure the heat load going into the air. The percentage of heat load going into the liquid at the server/rack level is related to the temperature difference between $T_{ai}$ and $T_{wi}$. The greater $T_{ai}$ is with respect to $T_{wi}$, the greater the heat load transferred to the liquid will be. Under optimal circumstances, $T_{ai}$ will be as much larger than $T_{wi}$ as possible. However, there is an upper as well as lower limit to both Tai and Twi. As such, $T_{ai}$ and $T_{wi}$ can be controlled to obtain a desired heat load distribution to liquid coolant and to air.

Figure 7:
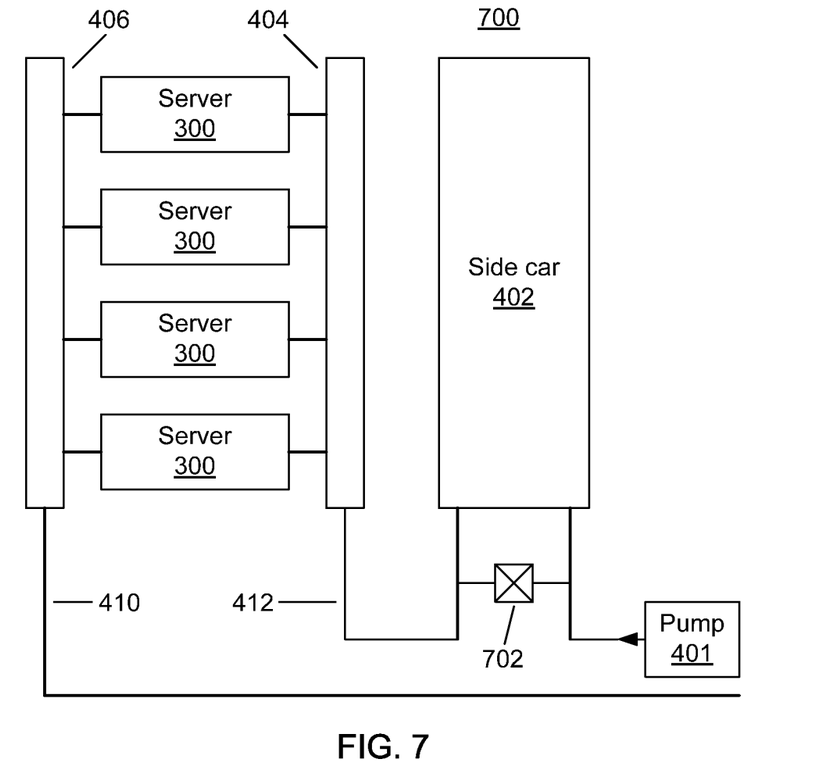
FIG. 7 is a diagram of an exemplary intra-rack cooling system according to the present principles.

Referring now to FIG. 7, an alternative embodiment of an intra-rack cooling system 700 is shown. Side car 402 is arranged in serial with the inlet plenum 404, such that input coolant flow 412 from pump 401 first passes through side car 402 and then enters the inlet plenum 404. A bypass two-way valve 702 is configured to provide a bypass path for the coolant to skip the side car 402. The valve 702 may be adjusted in steps, such that some coolant flows through side car 402 and some does not. This valve 702 may be adjusted in a manner similar to that discussed above in FIG. 6, where relative flow may be adjusted in the same manner, replacing changes to the three-way valve 502 with opening and closing the two-way valve 702.

Having described preferred embodiments of a system and method for coolant and ambient temperature control for chillerless liquid cooled data centers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A cooling system comprising:
   one or more nodes, each node having at least one temperature sensor to monitor a temperature of internal node components;
   an air-to-liquid heat exchanger configured to accept a liquid coolant input and to provide cooled air to the one or more nodes;
   a temperature sensor to monitor a temperature of the air provided by the air-to-liquid heat exchanger;
   a liquid cooling system configured to provide liquid coolant to components of the one or more nodes;
   a valve configured to control coolant flow to the air-to-liquid heat exchanger and the liquid cooling system based on the temperature of internal node components and the temperature of the air provided by the air-to-liquid heat exchanger; and
   a pump configured to provide liquid coolant to the liquid cooling system and the air-to-liquid heat exchanger, having a pump strength that is based on the temperature of internal node components and the temperature of the air provided by the air-to-liquid heat exchanger.

2. The cooling system of claim 1, further comprising control logic configured to compare a maximum internal node component temperature to a first and second component threshold and to compare the air temperature to a first and second air threshold.

3. The cooling system of claim 2, wherein the control logic is further configured to control the valve and the pump according to said comparisons.

4. The cooling system of claim 1, further comprising a flow rate valve configured to limit a coolant flow to the air-to-liquid heat exchanger based on the temperature of internal node components and the temperature of the air provided by the air-to-liquid heat exchanger.

5. The cooling system of claim 1, further comprising a flow rate valve configured to limit a coolant flow to the liquid cooling system based on the temperature of internal node components and the temperature of the air provided by the air-to-liquid heat exchanger.

6. The cooling system of claim 1, wherein the valve is a three-way valve that connects the air-to-liquid heat exchanger and the liquid cooling system to the pump in parallel.

7. The cooling system of claim 1, wherein the air-to-liquid heat exchanger and the liquid cooling system are connected serially and the valve is a two-way bypass valve.

8. The cooling system of claim 7, wherein the two-way bypass valve provides a bypass for the air-to-liquid heat exchanger, such that opening the two-way bypass valve allows coolant to flow directly to the liquid cooling system.

* * * * *